(12) United States Patent
Leobandung

(10) Patent No.: US 10,475,701 B2
(45) Date of Patent: Nov. 12, 2019

(54) MIXED WIRE STRUCTURE AND METHOD OF MAKING THE SAME

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/840,002

(22) Filed: Dec. 13, 2017

(65) Prior Publication Data
US 2019/0181043 A1 Jun. 13, 2019

(51) Int. Cl.
H01L 21/768 (2006.01)
H01L 23/522 (2006.01)
H01L 23/532 (2006.01)

(52) U.S. Cl.
CPC .. *H01L 21/76895* (2013.01); *H01L 21/76802* (2013.01); *H01L 21/76819* (2013.01); *H01L 21/76847* (2013.01); *H01L 21/76879* (2013.01); *H01L 23/5226* (2013.01); *H01L 23/53223* (2013.01); *H01L 23/53238* (2013.01)

(58) Field of Classification Search
None
See application file for complete search history.

(56) References Cited

U.S. PATENT DOCUMENTS

| | | | |
|---|---|---|---|
| 6,051,882 A | 4/2000 | Avanzino et al. | |
| 6,218,079 B1 * | 4/2001 | Shin | H01L 21/7681 257/E21.579 |
| 6,939,791 B2 | 9/2005 | Geffken et al. | |
| 7,187,084 B2 | 3/2007 | Jang et al. | |
| 8,357,609 B2 | 1/2013 | Ryan | |
| 8,765,595 B2 | 7/2014 | Cooney, III et al. | |
| 8,900,990 B2 | 12/2014 | Zhang et al. | |
| 9,601,426 B1 | 3/2017 | Bonilla et al. | |
| 2001/0055872 A1 * | 12/2001 | Fukazawa | H01L 21/76807 438/622 |

OTHER PUBLICATIONS

Anonymously, "Graphene Interconnect Structure and Formation," An IP.com Prior Art Database Technical Disclosure, IPCOM000238470D, Aug. 27, 2014, 4 pages.
Anonymously, "Method for a Cu interconnects system with low line resistivity and enhanced EM resistance," An IP.com Prior Art Database Technical Disclosure, IPCOM000132112D, Dec. 1, 2005, 7 pages.
Kincal et al., "RC Performance Evaluation of Interconnect Architecture Options Beyond the 10-nm Logic Node," IEEE Transactions on Electron Devices, vol. 61, Issue No. 6, Jun. 2014, pp. 1914-1919.

* cited by examiner

*Primary Examiner* — Anthony Ho
*Assistant Examiner* — Kevin Quinto
(74) *Attorney, Agent, or Firm* — Yee & Associates, P.C.

(57) ABSTRACT

A method for connecting metal layers in a mixed wire structure for a semiconductor substrate. A lower metal layer and a via in the mixed wired structure is formed in a dielectric structure on the semiconductor substrate, wherein a layer of a barrier metal is absent between the lower metal layer and the via. A trench is formed in the dielectric structure for an upper metal layer that contacts the via. A barrier metal layer is formed on the via and in the trench. The upper metal layer is formed after forming the barrier metal layer, wherein the barrier metal layer is located between the via and the upper metal layer.

14 Claims, 9 Drawing Sheets

MIXED WIRE STRUCTURE AND METHOD OF MAKING THE SAME

BACKGROUND

1. Field

The disclosure relates generally to semiconductor structures and, more specifically, to a method and an apparatus of connecting metal layers in a mixed patterning wire structure in a semiconductor substrate.

2. Description of the Related Art

Semiconductor fabrication involves manufacturing integrated circuits in semiconductor substrates. The process involves forming transistors and other devices directly in semiconductor substrates, such as silicon. Back end of line (BEOL) processing is a portion of the semiconductor fabrication process in which different semiconductor devices created in the semiconductor substrate are connected to form electrical circuits. This process involves creating layers of metal wires that are isolated by dielectric layers. These metal layers have patterns that connect the different semiconductor devices. The different metal layers for these wires are connected to each other by etching holes in the dielectric material and then depositing metal to form vias that connect the metal layers to each other. Vias are electrically conductive interconnects that connect metal layers to each other.

The current process for connecting metal layers to each other involves forming a hole for a via in the dielectric structure to a lower metal layer that has been already deposited in the dielectric structure. Additionally, a trench is formed for a metal layer in the dielectric structure. A metal barrier layer is deposited in the hole for the via and for the upper metal layer. A metal is then deposited to form the via and the upper metal layer. With this process, the barrier metal layer, or metal to metal contact, is located between the via and the lower metal layer. This process, however, is difficult to process and results in lower yields than desired.

SUMMARY

According to one embodiment of the present invention, a method for connecting metal layers in a mixed wire structure in a dielectric structure for a semiconductor substrate is present. A sacrificial layer is deposited on a layer of a first metal in the dielectric structure for the mixed wire structure, wherein the layer of the first metal is for a lower metal layer and a via in the mixed wired structure. A portion of the sacrificial layer is removed such that the layer of the first metal for the lower metal layer is exposed, and a remaining portion of the sacrificial layer on the layer of the first metal defines the via for the mixed wire structure. The layer of the first metal is etched, wherein a thickness of the layer of the first metal is reduced to form the lower metal layer and the via. Additional dielectric material is deposited on the dielectric material such that the lower metal layer is covered by the dielectric structure. The dielectric structure is planarized with the additional dielectric material such that the remaining portion of the sacrificial layer defining the via is exposed. The dielectric structure is etched to define a trench in the dielectric structure for an upper metal layer in the metal layers. A barrier metal is deposited onto a pattern for the upper metal layer to form a barrier metal layer. A second metal for the upper metal layer is deposited onto the barrier metal layer to connect the metal layers in the mixed wire structure.

According to another embodiment of the present invention, a method for connecting metal layers in a mixed wire structure for a semiconductor substrate is present. A lower metal layer and a via in the mixed wire structure in a dielectric structure are formed on the semiconductor substrate, wherein a layer of a barrier metal is absent between the lower metal layer and the via. Next, a trench in the dielectric structure for an upper metal layer that contacts the via is formed. Further, a barrier metal layer on the via and in the trench is formed. Even further, the upper metal layer after forming the barrier metal layer is formed, wherein the barrier metal layer is located between the via and the upper metal layer.

According to yet another embodiment of the present invention, a mixed wire structure for a semiconductor structure is presented. The mixed wire structure comprised a lower metal layer within a dielectric structure on the semiconductor substrate, a via within the dielectric structure, wherein the via is connected to the lower metal layer without a layer of a barrier metal, an upper metal layer within the dielectric structure, and a barrier metal layer between the via and the upper metal layer in the dielectric structure.

DETAILED DESCRIPTION

Figure 1:
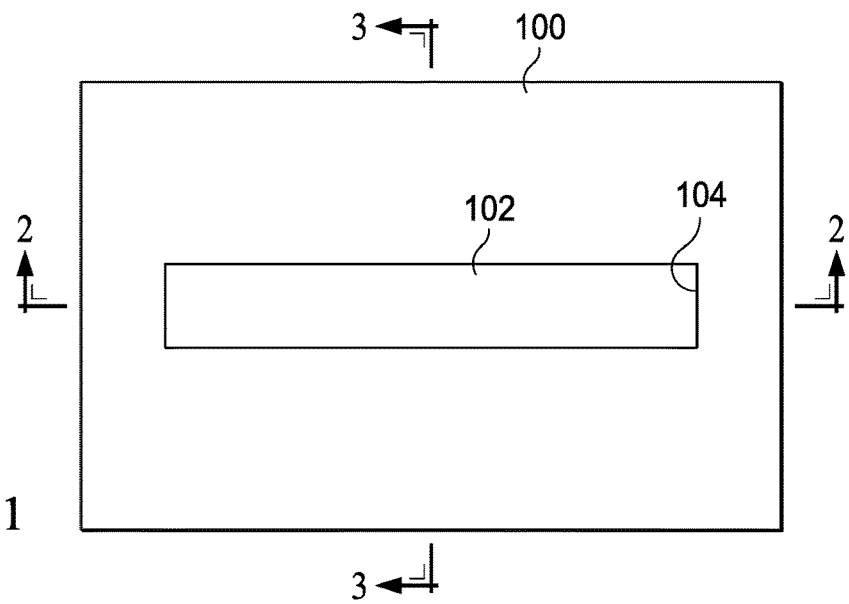
FIG. 1 is an illustration of a process for connecting metal layers in a mixed wire structure in accordance with an illustrative embodiment.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper," "lower," "right," "left," "vertical," "horizontal," "top," "bottom," and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element.

In this disclosure, when an element, such as a layer, region, or substrate is referred to as being "on" or "over" another element, the element can be directly on the other element or intervening elements can also be present. In contrast, when an element is referred to as being "directly on," "directly over," or "on and in direct contact with" another element, there are no intervening elements present, and the element is in contact with another element.

The processes, steps, and structures described below do not form a complete process flow for manufacturing integrated circuits. The disclosure can be practiced in conjunction with integrated circuit fabrication techniques currently used in the art, and only so much of the commonly practiced process steps are included as necessary for an understanding of the different examples of the present disclosure. The figures represent cross sections of a portion of an integrated circuit during fabrication and are not drawn to scale, but instead are drawn so as to illustrate different illustrative features of the disclosure.

With reference now to the figures and, in particular, with reference to FIG. 1, an illustration of a process for connecting metal layers in a mixed wire structure is depicted in accordance with an illustrative embodiment. In the interest of not obscuring the presentation of the illustrative examples, some processing steps or operations in the illustrative examples that are known may have been combined together for presentation and for illustration purposes and in some instances, may have not been described in detail. In other instances, some processing steps or operations that are known in the art may not be described at all. It should be understood that the following description is rather focused on the distinctive features or elements of various examples.

With reference first to FIG. 1, a top view of a dielectric structure for a semiconductor substrate is depicted in accordance with illustrative embodiment. In this illustrative example, dielectric structure 100 has layer of first metal 102 in trench 104 in dielectric structure 100. In this illustrative example, dielectric structure 100 is comprised of a material selected from a group comprising an interlevel dielectric, an oxide, a silicon dioxide, low-k dielectric, and other suitable dielectric materials.

As depicted, layer of first metal 102 is deposited in trench 104. In this example, layer of first metal 102 is comprised of a material for use in connecting semiconductor devices to each other. For example, the first metal can be selected from a group comprising copper (Cu), aluminum (Al), and other suitable metals or metal alloys for electrically connecting semiconductor devices.

In the illustrative examples, when a component is deposited, the deposition for the component can be any process that grows, coats, or otherwise transfers any material onto another component. In this depicted example, the deposition is of a first metal onto dielectric structure 100. In this illustrative example, layer of first metal 102 deposited in trench 104 is for a lower metal layer and a via.

Figure 2:
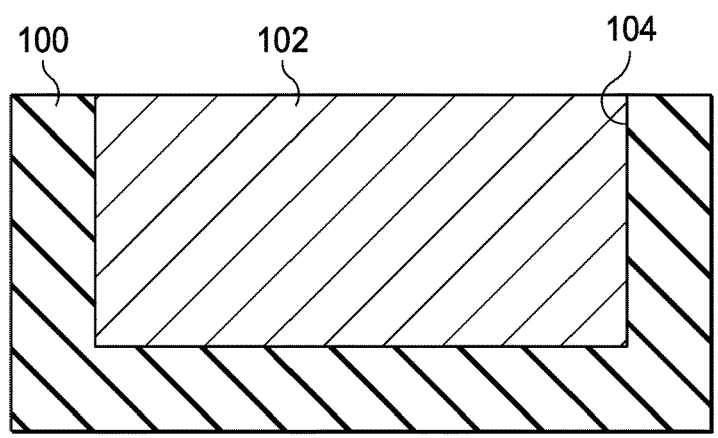
FIG. 2 is a cross-sectional view of a dielectric structure in accordance with an illustrative embodiment.

In FIG. 2, a cross-sectional view of dielectric structure 100 in FIG. 1 is depicted in accordance with an illustrative embodiment. In the illustrative examples, the same reference numeral may be used in more than one figure. This reuse of a reference numeral in different figures represents the same element in the different figures referred to by like reference numerals. In this example, a cross-sectional view of dielectric structure 100 with layer of first metal 102 in trench 104 is shown in the view taken along lines 2-2 in FIG. 1.

Figure 3:
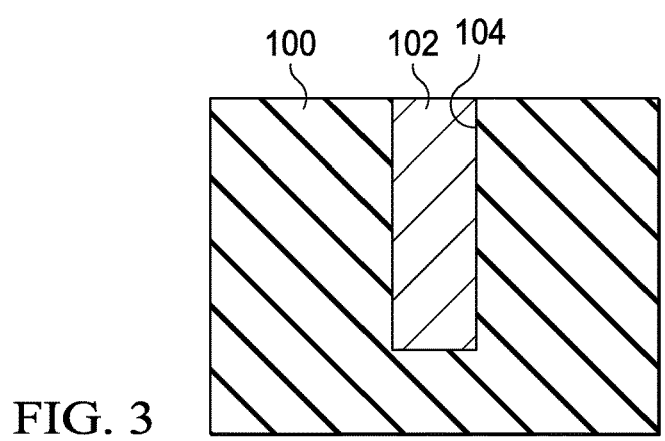
FIG. 3 is a cross-sectional view of a dielectric structure in accordance with an illustrative embodiment.

Next, FIG. 3 is another cross-sectional view of dielectric structure 100 in FIG. 1 depicted in accordance with an illustrative embodiment. In this figure, a cross-sectional view of dielectric structure 100 with layer of first metal 102 in trench 104 is shown taken along lines 3-3 in FIG. 1.

Figure 4:
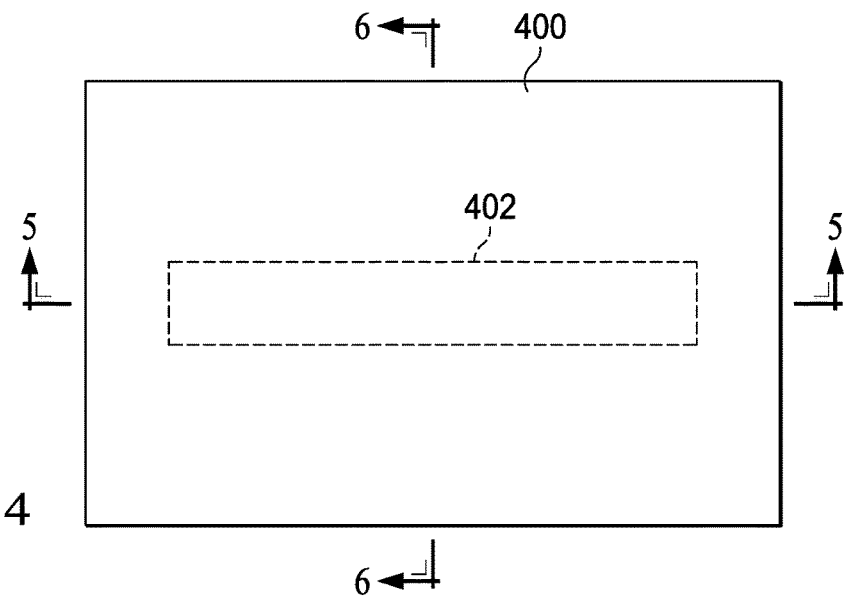
FIG. 4 is a top view of a dielectric structure with a sacrificial layer in accordance with an illustrative embodiment.

Turning to FIG. 4, a top view of dielectric structure 100 with sacrificial layer 400 is depicted in accordance with an illustrative embodiment. In this figure, sacrificial layer 400 is deposited on and covers dielectric structure 100 and layer of first metal 102. In this example, the location of layer of first metal 102 under sacrificial layer 400 is shown by dashed lines 402.

Figure 5:
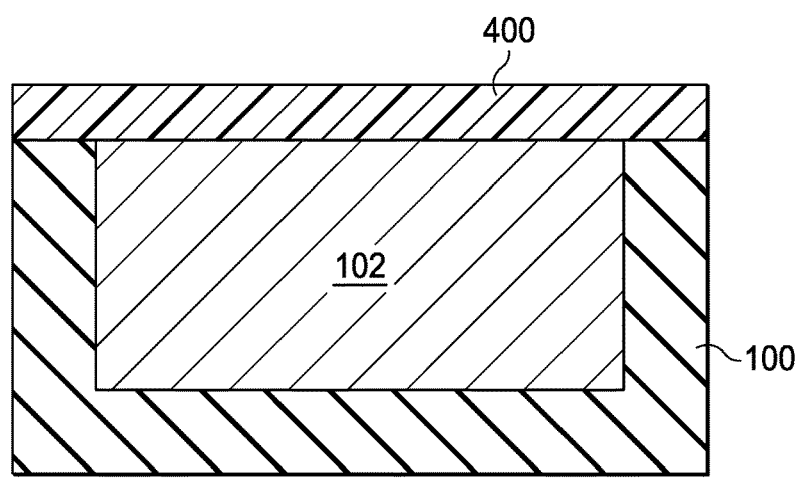
FIG. 5 is a cross-sectional view of a sacrificial layer shown on top of a layer of a first metal and a dielectric structure in accordance with an illustrative embodiment.

In FIG. 5, a cross-sectional view of sacrificial layer 400 shown on top of layer of first metal 102 and dielectric structure 100 is depicted in accordance with an illustrative embodiment.

Figure 6:
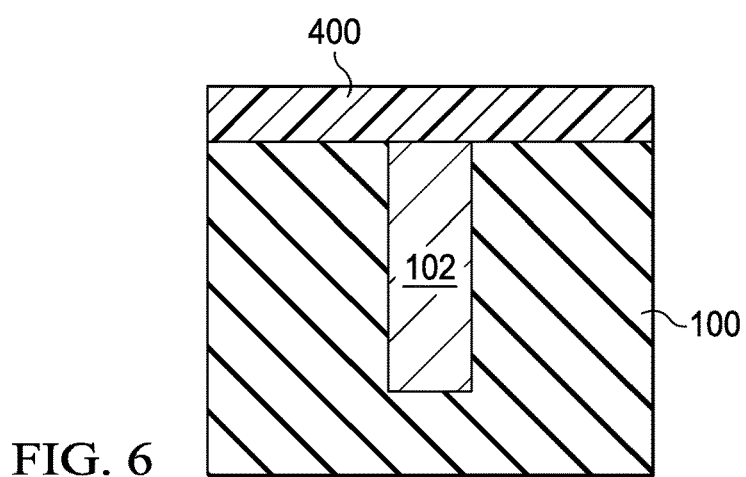
FIG. 6 is a cross-sectional view of a sacrificial layer on top of a layer of a first metal and a dielectric structure in accordance with an illustrative embodiment.

Next, FIG. 6 is another cross-sectional view of sacrificial layer 400 on top of layer of first metal 102 and dielectric structure 100 depicted in accordance with an illustrative embodiment. In this illustrative example, sacrificial layer 400 can be comprised of a material that is not attacked, or is minimally attacked, when metal etching is performed. In this example, sacrificial layer 400 is comprised of a material that is selected from the group comprising carbon, an amorphous carbon, boron nitride, and other suitable materials. Further, in this illustrative example, the material is selected as one that also is not etched while etching of dielectric structure 100 is performed.

Figure 7:
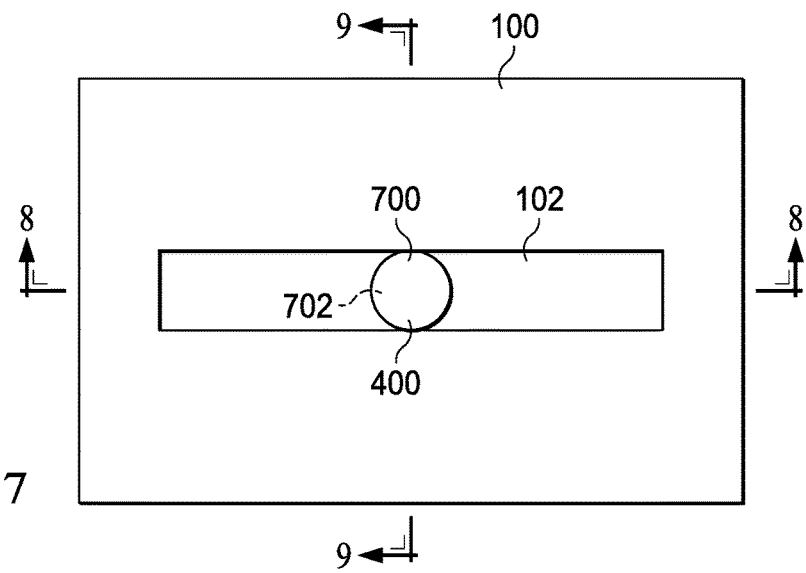
FIG. 7 is a top view of a dielectric structure after patterning and etching has been performed in accordance with an illustrative embodiment.

With reference now to FIG. 7, a top view of dielectric structure 100 after patterning and etching has been performed is depicted in accordance with an illustrative embodiment. In this example, a portion of sacrificial material 400 has been removed through etching such that layer of first metal 102 is exposed and remaining portion 700 of sacrificial layer 400 remains on layer of first metal 102. Remaining portion 700 of sacrificial layer 400 defines via 702 for a mixed wire structure. In this illustrative example, the etching of sacrificial layer 400 and layer of first metal 102 can be performed to form via 702 as a subtractive patterning process.

Figure 8:
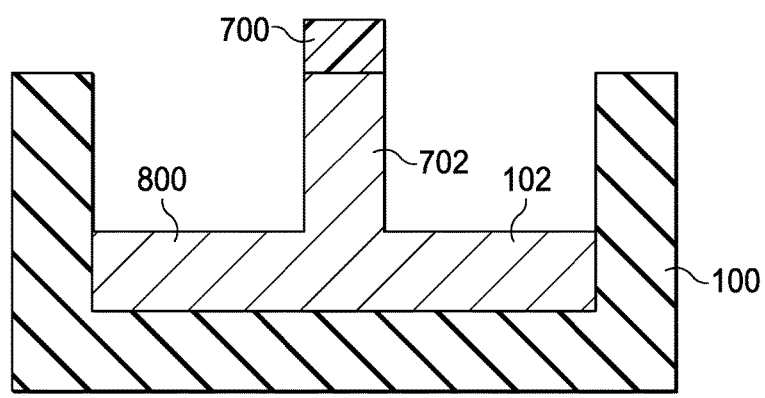
FIG. 8 is a cross-sectional view of a dielectric structure after patterning etching in accordance with an illustrative embodiment.

In FIG. 8, a cross-sectional view of dielectric structure 100 after patterning and etching is depicted in accordance with an illustrative embodiment. In this cross-sectional view, layer of first metal 102 is shown as having been etched to reduce the thickness of layer of first metal 102 to form lower metal layer 800. Additionally, in this cross-sectional view, the etching has also formed via 702.

Figure 9:
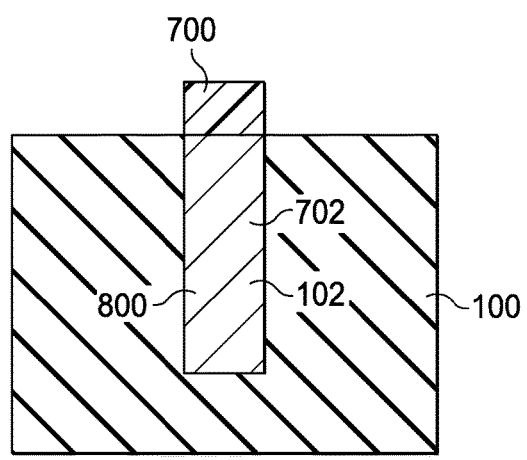
FIG. 9 is a cross-sectional view of a dielectric structure in accordance with an illustrative embodiment.

With reference to FIG. 9, a cross-sectional view of dielectric structure 100 is depicted in accordance with an illustrative embodiment. In this figure, dielectric structure 100 is shown taken along lines 9-9 in FIG. 7.

Figure 10:
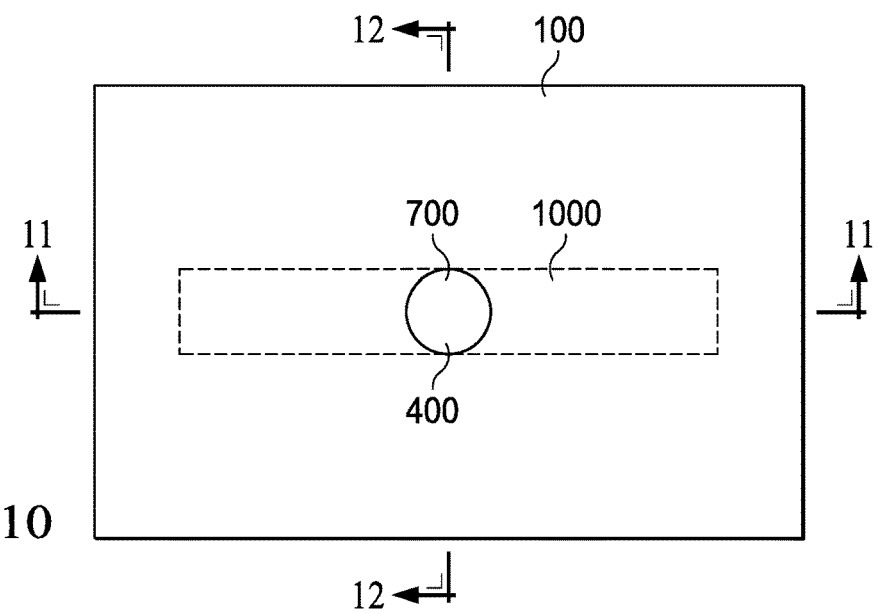
FIG. 10 is a top view of a dielectric structure in accordance with an illustrative embodiment.

Turning to FIG. 10, a top view of dielectric structure 100 is depicted in accordance with an illustrative embodiment. Dielectric structure 100 is shown after depositing additional dielectric material on dielectric structure 100 and planarizing dielectric structure 100 with the additional dielectric material. This additional dielectric material is an interlevel dielectric (ILD) in this illustrative example. As can be seen in this top view, the location of lower metal layer 800 is shown by dashed line 1000.

Figure 11:
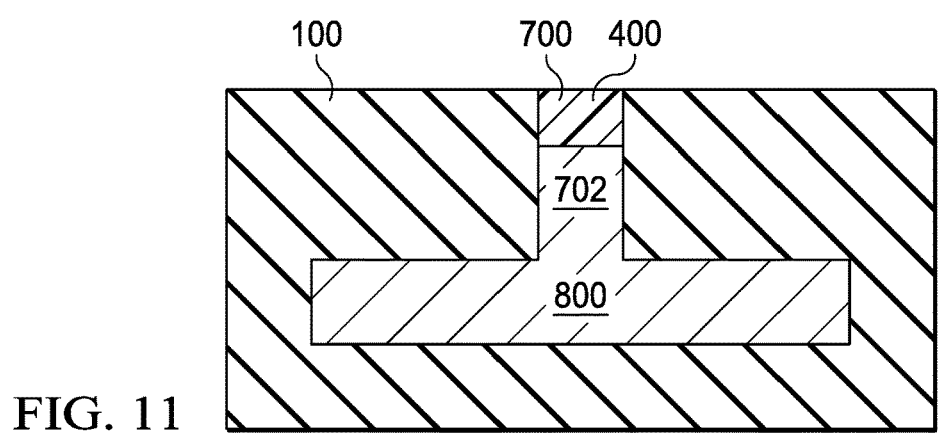
FIG. 11 is a cross-sectional view of a dielectric structure in accordance with an illustrative embodiment.

In FIG. 11, a cross-sectional view of dielectric structure 100 is depicted in accordance with an illustrative embodiment. In FIG. 11, dielectric structure 100 is shown taken along lines 11-11 in FIG. 9.

Figure 12:
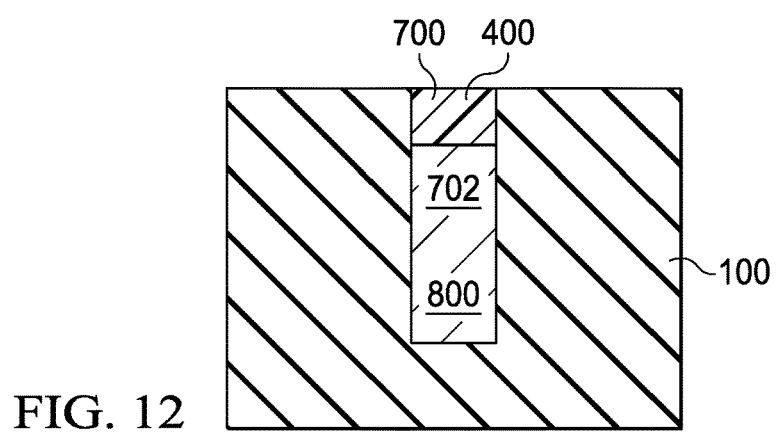
FIG. 12 is a cross-sectional view of a dielectric structure in accordance with an illustrative embodiment.

Next, FIG. 12 a cross-sectional view of dielectric structure 100 is depicted in accordance with an illustrative embodiment. In FIG. 12, dielectric structure 100 is shown taken along lines 12-12 in FIG. 10.

Figure 13:
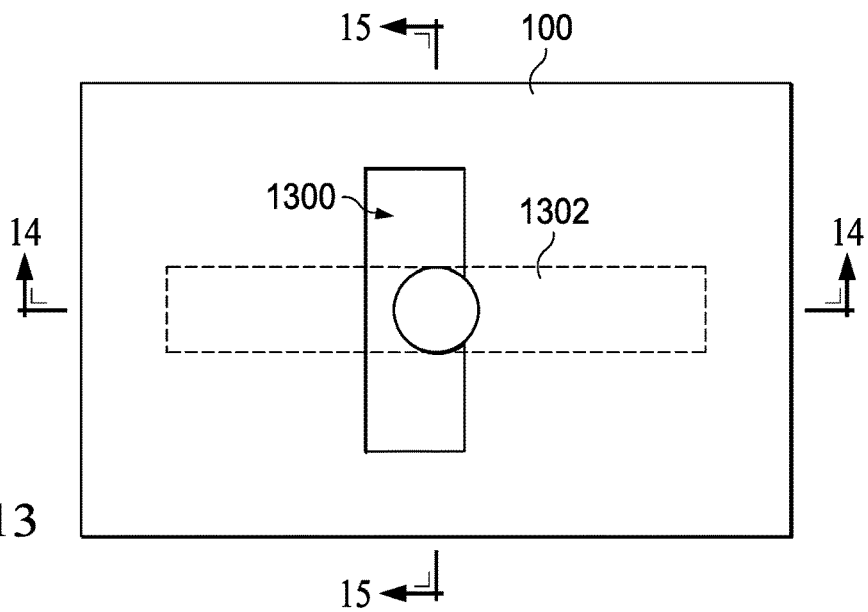
FIG. 13 is a top view of a dielectric structure in accordance with an illustrative embodiment.

With reference next to FIG. 13, a top view of dielectric structure 100 is shown with trench 1300 in dielectric structure 100. As depicted, remaining portion 700 of sacrificial layer 400 has been etched away. In this figure, portions of dielectric structure 100 also have been etched to form trench 1300 for depositing an upper metal layer. The location of lower metal layer 800 within dielectric structure 100 is shown by dashed line 1302. In this example, trench 1300 is a second trench, while trench 104 in FIG. 1 is a first trench in dielectric structure 100.

Figure 14:
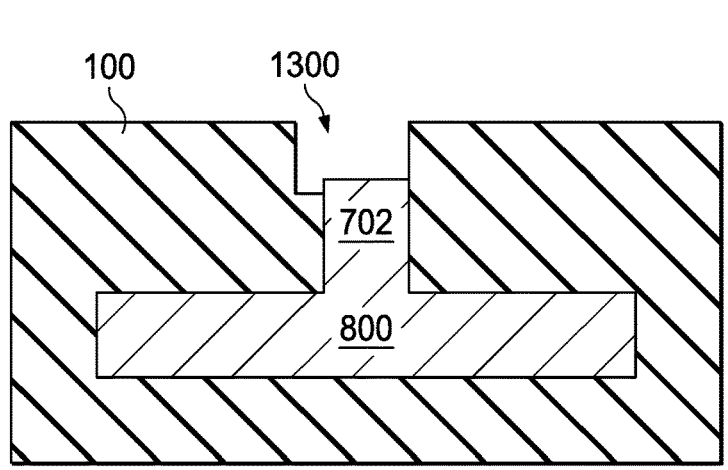
FIG. 14 is a cross-sectional view of a dielectric structure in accordance with an illustrative embodiment.

FIG. 14 is a cross-sectional view of dielectric structure 100 depicted in accordance with an illustrative embodiment. In FIG. 14, dielectric structure 100 is shown taken along lines 14-14 in FIG. 13.

Figure 15:
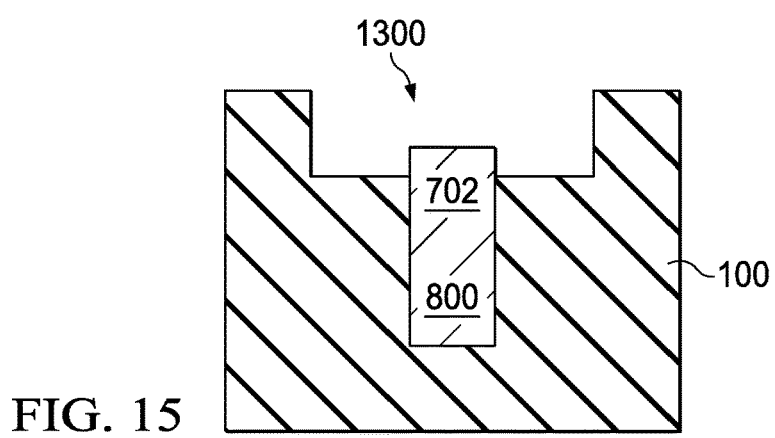
FIG. 15 is a cross-sectional view of a dielectric structure in accordance with an illustrative embodiment.

In FIG. 15, another cross-sectional view of dielectric structure 100 is depicted in accordance with an illustrative embodiment. In FIG. 15, dielectric structure 100 is shown taken along lines 15-15 in FIG. 13.

Figure 16:
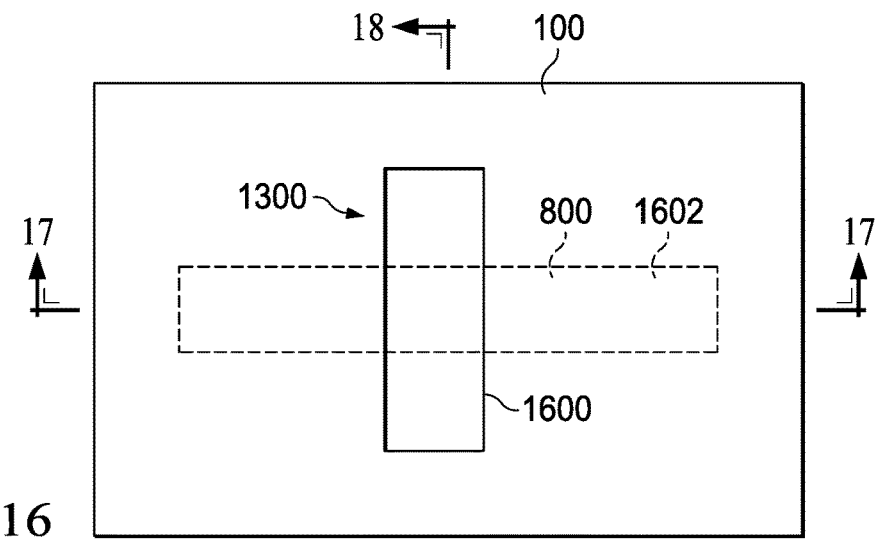
FIG. 16 is a top view of a dielectric structure in accordance with an illustrative embodiment.

Turning to FIG. 16, a top view of dielectric structure 100 is shown in which a barrier metal has been deposited in trench 1300 to form barrier metal layer 1600 in dielectric structure 100. In this example, the location of lower metal layer 800 within dielectric structure 100 is shown by dashed line 1602. As depicted, the barrier metal is comprised of a material selected from a group comprising titanium (Ti), titanium nitride (TiN), tantalum nitride (TaN), nickel titanium (NiTi), cobalt (Co), and other suitable metals. The metal selected for barrier metal layer 1600 is selected as a metal that protects via 702 from being attacked during deposition of the upper metal layer.

Figure 17:
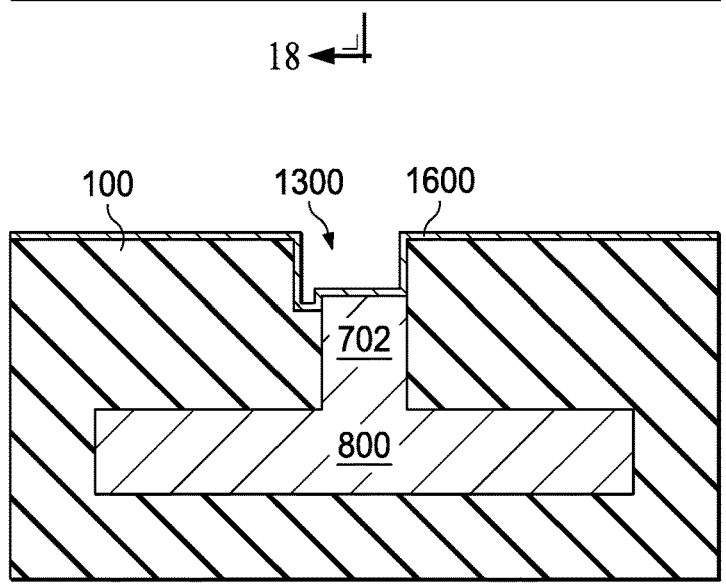
FIG. 17 is a cross-sectional view of a dielectric structure in accordance with an illustrative embodiment.

FIG. 17 is a cross-sectional view of dielectric structure 100 depicted in accordance with an illustrative embodiment. In FIG. 17, dielectric structure 100 is shown taken along lines 17-17 in FIG. 16.

Figure 18:
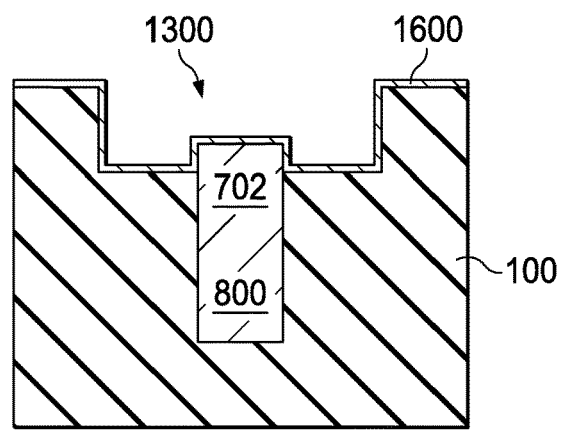
FIG. 18 is a cross-sectional view of a dielectric structure in accordance with an illustrative embodiment.

In FIG. 18, another cross-sectional view of dielectric structure 100 is depicted in accordance with an illustrative embodiment. In FIG. 18, dielectric structure 100 is shown taken along lines 18-18 in FIG. 16.

Figure 19:
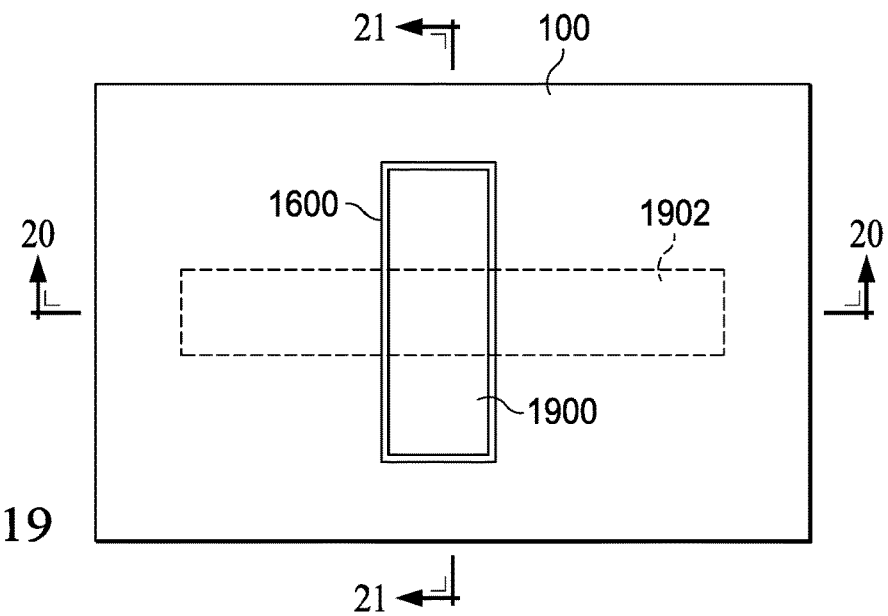
FIG. 19 is a top view of a dielectric structure in accordance with an illustrative embodiment.

With reference to FIG. 19, a top view of dielectric structure 100 is depicted in which upper metal layer 1900 has been formed. In this illustrative example, the location of lower metal layer 800 in dielectric structure 100 is shown by dashed line 1902.

Figure 20:
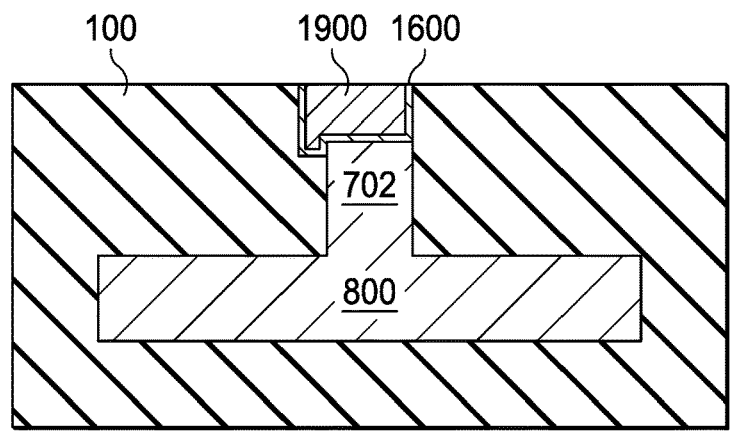
FIG. 20 is a cross-sectional view of a dielectric structure in accordance with an illustrative embodiment.

In FIG. 20, a cross-sectional view of dielectric structure 100 is depicted in accordance with an illustrative embodiment. In FIG. 20, dielectric structure 100 is shown taken along lines 20-20 in FIG. 19.

Figure 21:
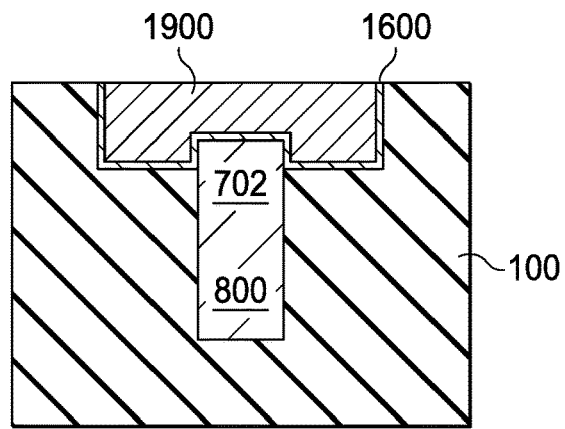
FIG. 21 is a cross-sectional view of a dielectric structure in accordance with an illustrative embodiment.

FIG. 21 is another cross-sectional view of dielectric structure 100 depicted in accordance with an illustrative embodiment. In FIG. 21, dielectric structure 100 is shown taken along lines 21-21 in FIG. 19.

As seen in this illustrative example, the aspect ratio for depositing barrier metal layer 1600 is greater than if barrier metal layer 1600 were deposited between via 702 and lower metal layer 800 using currently known processes connecting metal layers using vias. With a lower aspect ratio, the depth of trench 1300 is shallower as compared to the depth of a hole for a via formed using currently known processes. As a result, depositing the barrier metal to form barrier metal layer 1600 is easier to perform as compared to current processes. Further, with the lower aspect ratio, upper metal layer 1900 can also be formed with a more uniform thickness, less voids, and improve overall resistance as compared to using current processes.

As a result, the process illustrated in FIGS. 1-21 overcome a technical problem with yields when forming connections between metal layers in a mixed wire structure in a dielectric structure for a semiconductor substrate. One or more technical solutions are present in the illustrative example that increases the yield of wafers and chips when connecting metal layers to each other using vias or other types of interconnects. One or more technical solutions is present in which the aspect ratio for the trench in which the metal barrier layer is deposited is lower as compared to depositing the barrier metal layer into a hole using currently available processes connecting metal layers to each other. The lower aspect ratio provides a technical solution that increases the yields when manufacturing semiconductor devices on semiconductor substrates. Additionally, the contact area between via 702 and upper metal layer 1900 can be greater as compared to the contact area present utilizing current techniques for connecting metal layers.

The illustration of process for connecting metal layers in FIG. 1-21 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, one or more metal layers may be formed with one or more additional vias in addition to upper metal layer 1900, via 702, and lower metal layer 800. As another example, via 702 is shown as cylindrical. In other illustrative examples, the via can have other cross-section shapes such as an oval, a square, an irregular shape, or some other cross-sectional shape. Further, the cross-section can change within the via. In one illustrative example, the cross-section of a circular via can change in diameter.

Figure 22:
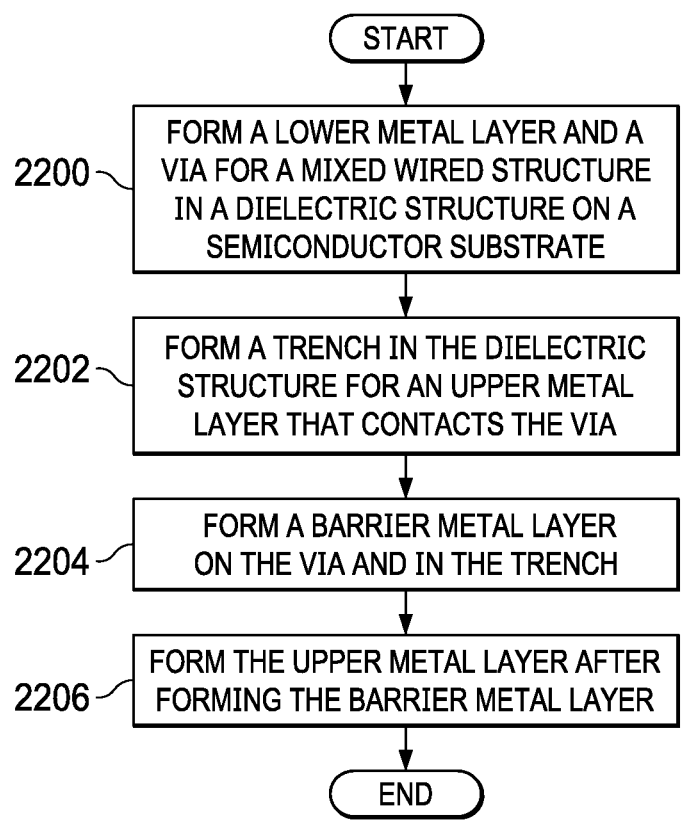
FIG. 22 is a flowchart of a process for connecting metal layers for a semiconductor substrate in accordance with an illustrative embodiment.

Turning next to FIG. 22, a flowchart of a process for connecting metal layers for a semiconductor substrate is depicted in accordance with an illustrative embodiment. The process illustrated in FIG. 22 can be implemented to perform the steps described for connecting metal layers in FIGS. 1-21.

The process begins by forming a lower metal layer and a via for a mixed wired structure in a dielectric structure on a semiconductor substrate (step 2200). In step 2200, a layer of a barrier metal is absent between the lower metal layer and the via.

The process forms a trench in the dielectric structure for an upper metal layer that contacts the via (step 2202). The process forms a barrier metal layer on the via and in the trench (step 2204). The process forms the upper metal layer after forming the barrier metal layer (step 2206). The process terminates thereafter. The barrier metal layer is located between the via and the upper metal layer with a barrier metal layer being absent between the via and the lower metal layer.

Figure 23:
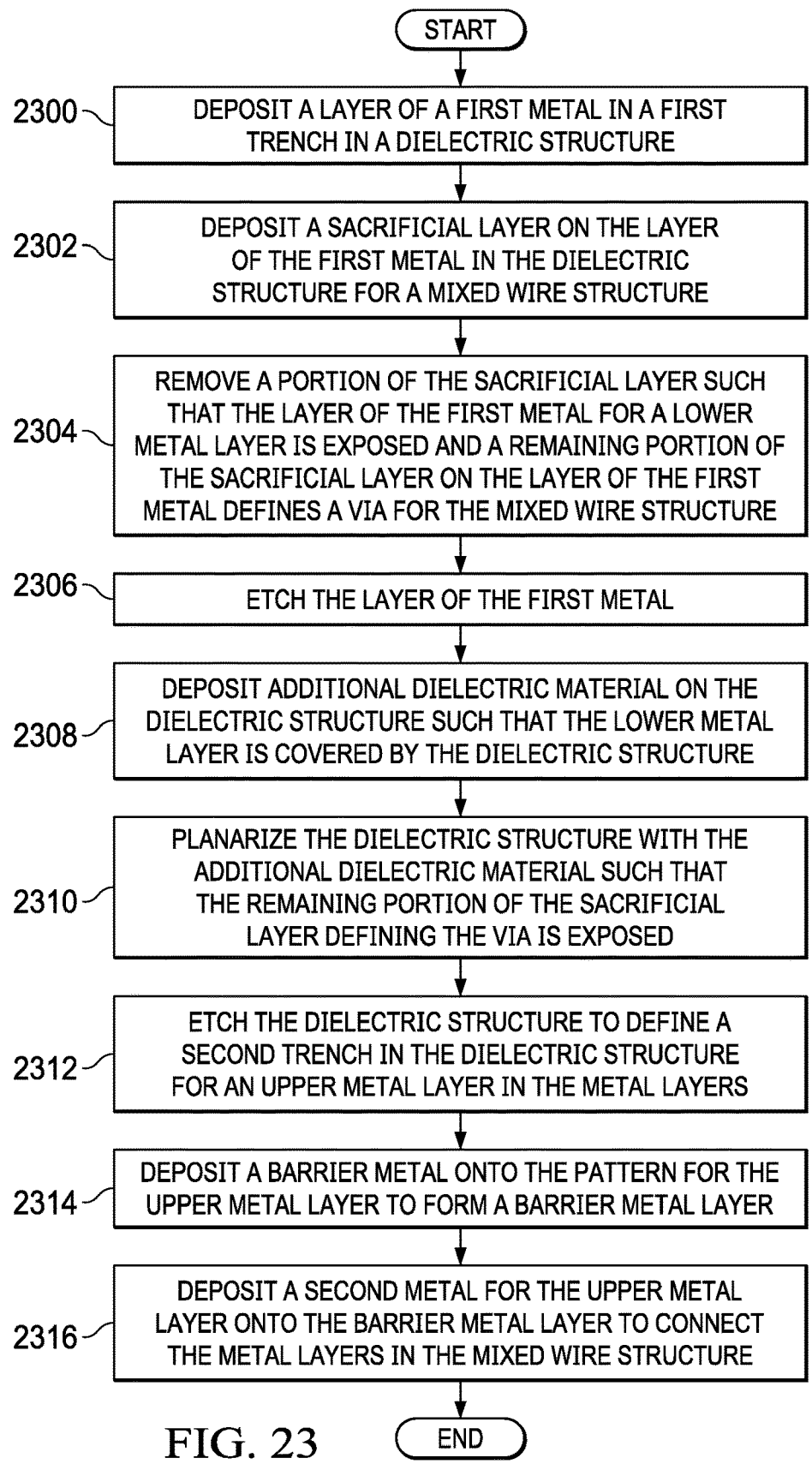
FIG. 23 is a flowchart of a process for connecting metal layers in a mixed wire structure in a dielectric structure for a semiconductor substrate in accordance with an illustrative embodiment.

Turning to FIG. 23, a flowchart of process for connecting metal layers in a mixed wire structure in a dielectric structure for a semiconductor substrate is depicted in accordance with an illustrative embodiment. The process illustrated in this flowchart can be implemented to perform the steps described for connecting metal layers in FIGS. 1-21.

The process begins by depositing a layer of a first metal in a first trench in a dielectric structure (step 2300). This layer of a first metal is for a lower metal layer and the via in the mixed wire structure. The process deposits a sacrificial layer on the layer of the first metal in the dielectric structure for a mixed wire structure (step 2302). Next, the process removes a portion of the sacrificial layer such that the layer of the first metal for the lower metal layer is exposed, and a remaining portion of the sacrificial layer on the layer of the first metal defines a via for the mixed wire structure (step 2304). The process etches the layer of the first metal (step 2306). A thickness of the layer of the first metal is reduced to form the lower metal layer and the via in step 2306.

The process deposits additional dielectric material on the dielectric structure such that the lower metal layer is covered by the dielectric structure (step 2308). In step 2308, the additional dielectric material can be considered an interlevel dielectric (ILD). The depositing of the additional dielectric material can be such that a lower metal layer and the remaining portion of the sacrificial layer are covered by the dielectric structure.

The process planarizes the dielectric structure with the additional dielectric material such that the remaining portion of the sacrificial layer defining the via is exposed (step 2310). This step can be performed by performing chemical mechanical planarization (CMP) such that a top of the sacrificial layer is exposed.

The process etches the dielectric structure to define a second trench in the dielectric structure for an upper metal layer in the metal layers (step 2312). The process deposits a barrier metal onto the pattern for the upper metal layer to form a barrier metal layer (step 2314). The process deposits a second metal for the upper metal layer onto the barrier metal layer to connect the metal layers in the mixed wire structure (step 2316). The process terminates thereafter. In the illustrative example, the process can be subtractive patterning on which a damascene process is fabricated on.

In the illustrative example, the first metal can be the second metal. In other words, the first metal for the lower metal layer and the second metal for the upper metal layer may be the same material. In other illustrative examples, the first metal and second metal may be different metal materials. Thus, the lower metal layer and the upper metal layer can be processed to connect semiconductor devices in the semiconductor substrate to each other.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams may be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figure. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, additional steps showing patterning the photoresist or other materials for etching for depositing steps may be present although not described in the flowcharts. In yet another illustrative example, one or more additional metal layers may be added to the upper metal layer and the lower metal layer connected by the via. The one or more additional metal layers may be connected to the upper metal layer by one or more additional vias in these illustrative examples.

Thus, illustrative embodiments of the present invention provide a computer implemented method, computer system, and computer program product for connecting metal layers in a mixed wire structure and a dielectric structure for a semiconductor substrate. The process begins by forming a lower metal layer and a via in for a mixed wired structure in a dielectric structure on the semiconductor substrate, wherein a layer of a barrier metal is absent between the lower metal layer and the via. The process forms a trench in the dielectric structure for an upper metal layer that contacts the via. The process forms a barrier metal layer on the via and in the trench. The process forms the upper metal layer after forming the barrier metal layer, wherein the barrier metal layer is located between the vial and the upper metal layer.

In one illustrative example, the process results in a mixed wire structure for a semiconductor substrate. The mixed wire structure comprises a lower metal layer, a via, an upper metal layer, and a barrier metal layer. The lower metal layer is located within a dielectric structure on the semiconductor substrate. The via is within dielectric structure, wherein the via is connected to the lower metal layer, without a layer of a barrier metal. The upper metal layer is within the dielectric structure, and the barrier metal layer, or metal to metal contact, is between the via and the upper metal layer in the dielectric structure. The barrier layer is a type of metal to metal contact. Other illustrative examples can employ any type of metal to metal contact between a via and the upper metal layer.

The process utilized to create the structure results in greater yields when fabricating integrated circuits for chips. One illustrative example provides a technical solution in which a lower aspect ratio is present as compared to currently used techniques to connect metal layers to each other. As a result, depositing the barrier layer and an upper metal layer can be performed more easily. Further, overall resistance can be improved with a thinner barrier metal layer. In other words, lower resistance may be achieved. Further, the larger contact area also can be achieved using a process in the illustrative example.

The methods and structures that have been described above with reference to figures in the different examples may be employed in any electrical device including integrated circuit chips. The integrated circuit chips including the disclosed structures and formed using the disclosed methods may be integrated with other chips, discrete circuit elements, and/or other signal processing devices as part of either an intermediate product, such as a motherboard, or an end product. The end product can be any product that includes integrated circuit chips, including computer products or devices having a display, a keyboard or other input device, and a processor unit.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiment. The terminology used herein was chosen to best explain the principles of the embodiment, the practical application or technical improvement over technologies found in the marketplace, or to enable others of ordinary skill in the art to understand the embodiments disclosed here.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for connecting metal layers in a mixed wire structure in a dielectric structure for a semiconductor substrate, the method comprising:
    depositing a sacrificial layer on a layer of a first metal in the dielectric structure for the mixed wire structure, wherein the layer of the first metal is for a lower metal layer and a via in the mixed wired structure;
    removing a portion of the sacrificial layer such that the layer of the first metal for the lower metal layer is exposed, and a remaining portion of the sacrificial layer on the layer of the first metal defines the via for the mixed wire structure;
    etching the layer of the first metal, wherein a thickness of the layer of the first metal is reduced to form the lower metal layer and the via;
    depositing additional dielectric material on the dielectric structure such that the lower metal layer is covered by the dielectric structure;
    planarizing the dielectric structure with the additional dielectric material such that the remaining portion of the sacrificial layer defining the via is exposed;
    etching the dielectric structure to define a trench in the dielectric structure for an upper metal layer in the metal layers;
    depositing a barrier metal onto a pattern for the upper metal layer to form a barrier metal layer; and
    depositing a second metal for a layer of a second metal onto the barrier metal layer to connect the metal layers in the mixed wire structure.

2. The method of claim 1, wherein depositing the additional dielectric material on the dielectric structure such that the lower metal layer is covered by the additional dielectric material comprises:
    depositing the additional dielectric material on the dielectric structure such that the layer of the first metal is covered by the dielectric structure and the remaining portion of the sacrificial layer is covered by the dielectric structure.

3. The method of claim 2, wherein planarizing the dielectric structure with the additional dielectric material such that the remaining portion of the sacrificial layer defining the via is exposed further comprises:
    performing chemical mechanical planarization such that a top of the sacrificial layer is exposed.

4. The method of claim 1 further comprising:
    depositing the layer of the first metal in a first trench in the dielectric structure in which the layer of the first metal is for the lower metal layer and the via.

5. The method of claim 1, wherein the sacrificial layer is selected from a group comprising carbon and an amorphous carbon.

6. The method of claim 1, wherein the dielectric structure is comprised of a material selected from a group comprising an interlevel dielectric, an oxide, and a silicon dioxide.

7. The method of claim 1, wherein the first metal is the second metal.

8. The method of claim 1, wherein the first metal and the second metal are each selected from a group comprising copper and aluminum.

9. The method of claim 1, wherein the barrier metal is selected from a group comprising titanium (Ti), titanium nitride (TiN), tantalum nitride (TaN), nickel titanium (NiTi), and cobalt (Co).

10. The method of claim 1, wherein the layer of the first metal and the layer of the second metal connect semiconductor devices in the semiconductor substrate to each other.

11. A method for connecting metal layers in a mixed wire structure for a semiconductor substrate, the method comprising:
forming a lower metal layer and a via in the mixed wired structure in a dielectric structure on the semiconductor substrate, wherein a layer of a barrier metal is absent between the lower metal layer and the via;
forming a trench in the dielectric structure for an upper metal layer that contacts the via;
forming a barrier metal layer on the via and in the trench;
forming the upper metal layer after forming the barrier metal layer, wherein the barrier metal layer is located between the via and the upper metal layer;
depositing a sacrificial layer on a layer of a first metal in the dielectric structure for the mixed wire structure, wherein the layer of the first metal is for the lower metal layer and the via in the mixed wired structure;
removing a portion of the sacrificial layer such that the layer of the first metal for the lower metal layer is exposed and a remaining portion of the sacrificial layer on the layer of the first metal defines the via for the mixed wire structure;
etching the layer of the first metal, wherein a thickness of the layer of the first metal is reduced to form the lower metal layer and the via;
depositing additional dielectric material on the dielectric structure such that the lower metal layer is covered by the dielectric structure; and
planarizing the dielectric structure with the additional dielectric material such that the remaining portion of the sacrificial layer defining the via is exposed,
wherein, forming a trench in the dielectric structure for the upper metal layer that contacts the via comprises:
etching the dielectric structure after planarizing the dielectric structure to define a pattern in the dielectric structure for the upper metal layer in the metal layers.

12. The method of claim 11, wherein the dielectric structure is comprised of a material selected from a group comprising an interlevel dielectric, an oxide, and a silicon dioxide.

13. The method of claim 11, wherein depositing the additional dielectric material on the dielectric structure such that the lower metal layer is covered by the additional dielectric material comprises:
depositing the additional dielectric material on the dielectric structure such that the lower metal layer is covered by the dielectric structure and the remaining portion of the sacrificial layer is covered by the dielectric structure.

14. The method of claim 13, wherein planarizing the dielectric structure with the additional dielectric material such that the remaining portion of the sacrificial layer defining the via is exposed further comprises:
performing chemical mechanical planarization such that a top of the sacrificial layer is exposed.

* * * * *